United States Patent [19]

Dworsky

[11] Patent Number: 4,525,647
[45] Date of Patent: Jun. 25, 1985

[54] DUAL FREQUENCY, DUAL MODE QUARTZ RESONATOR

[75] Inventor: Lawrence N. Dworsky, Northbrook, Ill.

[73] Assignee: Motorola, Inc., Schaumburg, Ill.

[21] Appl. No.: 697,688

[22] Filed: Feb. 4, 1985

Related U.S. Application Data

[63] Continuation-in-part of Ser. No. 557,692, Dec. 2, 1983, abandoned.

[51] Int. Cl.$^3$ ............................................ H01L 41/08
[52] U.S. Cl. .................................... 310/361; 310/315; 310/368
[58] Field of Search ............... 310/360, 361, 367, 368, 310/315

[56] References Cited

U.S. PATENT DOCUMENTS

| | | | |
|---|---|---|---|
| 3,792,294 | 2/1974 | Royer | 310/361 |
| 3,826,931 | 7/1974 | Hammond | 310/8.1 |
| 4,039,969 | 8/1977 | Martin | 331/40 |
| 4,071,797 | 1/1978 | Zumsteg et al. | 310/361 |
| 4,076,987 | 2/1978 | Zumsteg | 310/361 |
| 4,079,280 | 3/1978 | Kusters et al. | 310/318 |
| 4,144,747 | 3/1979 | Datwyler, Jr. | 73/141 R |
| 4,160,183 | 7/1979 | Kusters et al. | 310/315 |
| 4,320,320 | 3/1982 | Momosaki et al. | 310/361 |

FOREIGN PATENT DOCUMENTS

| | | | |
|---|---|---|---|
| 46633 | 4/1980 | Japan | 310/361 |
| 2037070 | 7/1980 | United Kingdom | 310/361 |

OTHER PUBLICATIONS

R. D. Mindlin, "Third Overtone Quartz Resonator", 36th Annual Frequency Control Symposium, (Jun. 1982), 3–21.

Primary Examiner—Mark O. Budd
Attorney, Agent, or Firm—Charles L. Warren; Edward M. Roney; James W. Gillman

[57] ABSTRACT

This invention is directed to an AT-cut quartz resonator having two different resonant modes simultaneously occurring in which a generally rectangular polyhedron has first and second electrodes disposed on opposing faces, and having the width to height selected within the range of 8 to 25. The width is selected such that a thickness shear mode and flexure mode are simultaneously excitable and coupled together. The AT rotation angle is selected so that a first signal responsive to the coupled flexure mode and thickness shear mode has a substantially cubic frequency versus temperature response over a desired temperature range and a second signal responsive to the coupled flexure and thickness shear modes has a substantially linear frequency versus temperature response over the desired temperature range. This invention also contemplates an apparatus for generating an output signal having a stable frequency versus temperature characteristic utilizing such a resonator and further contemplates a method for generating such a temperature compensated output signal.

27 Claims, 5 Drawing Figures

DUAL FREQUENCY, DUAL MODE QUARTZ RESONATOR

This is a continuation-in-part of application Ser. No. 557,692, filed Dec. 2, 1983, now abandoned.

BACKGROUND OF THE INVENTION

This invention relates generally to quartz crystal resonators having a design which minimizes changes in frequency due to temperature variations. The invention is more specifically directed to a quartz crystal capable of simultaneously operating in two different modes: one mode having a relatively stable cubic frequency versus temperature characteristic and the other mode exhibiting a substantial change in frequency for temperature variations making it suitable for use as a thermometer.

This invention also contemplates a method for and an apparatus which uses such a dual mode resonator to generate an output signal having a highly stable frequency versus temperature characteristic.

It is well known that quartz crystal resonators when utilized as the frequency controlling element in an oscillator can provide better frequency versus temperature stability than when inductors, capacitors, and resistors are used as the frequency controlling elements. Despite the relatively good frequency stability offered by conventional quartz crystals such as a single mode AT-cut crystal, even greater frequency stability is required for certain applications. For example, in UHF transmitter and receiver applications where the frequency of the local oscillator is multiplied many times to yield the desired frequency, an exceptionally high level of frequency versus temperature stability is required to achieve the desired degree of stability for the derived UHF frequency.

Enhanced frequency stability has been achieved by varying an external reactance in circuit with the crystal resonator in an effort to compensate for frequency variations with temperature inherent in the crystal resonator. Typically a temperature sensor external to the quartz resonator is utilized to provide a temperature responsive signal which is utilized by appropriate compensation circuitry to minimize changes in frequency due to the frequency versus temperature characteristic of the crystal resonator. Another conventional approach to enhance stability has been to place the frequency controlling quartz resonator in a temperature controlled oven to minimize changes in temperature of the resonator.

In U.S. Pat. No. 4,039,969 for a quartz thermometer issued to Jean-Claude Martin, a single quartz crystal element includes a first set of electrodes to excite one mode which yields a relatively stable frequency and another orthogonal set of electrodes which induces a second mode having a temperature variable frequency. The difference between these two frequencies is utilized to provide a indication of the temperature.

A tuning fork type quartz crystal vibrator for low frequency oscillators is described in U.S. Pat. No. 4,320,320 issued to Eishi Momosaki et al. The quartz is cut at an angle which establishes a coupled relationship between the flexural and torsional modes of vibration of the arms to provide a favorable cubic frequency temperature characteristic. A wide range of frequency adjustments is made possible by adding weights to the vibrator. Such vibrators are used in electronic wrist watches having frequencies in the range of 100 KHZ.

In U.S. Pat. No. 3,826,931 issued to Donald L. Hammond a double rotated crystal is vibrated in two selected modes simultaneously to provide a stable output frequency which is obtained by the algebraic combination of the separate frequencies corresponding to the modes.

A temperature compensated crystal force transducer is described in U.S. Pat. No. 4,144,747 issued to Walter F. Datwyler, Jr. wherein the crystal is simultaneously resonated in two different modes. The crystal has at least one anharmonic mode having a frequency-force characteristic different from the other mode.

U.S. Pat. Nos. 4,079,280 and 4,160,183 both issued to John A. Kusters et al. are directed to the use of a double rotated quartz crystal which is operated in two different modes. The frequency-temperature deviation of one of the modes is used as an internal thermometer and the second mode as a reference frequency signal which is compensated in accordance with the difference in frequency between the two modes to minimize frequency versus temperature variations.

SUMMARY OF THE INVENTION

An object of this invention is to provide a single rotated quartz crystal resonator which can be manufactured economically and which has two different resonant frequencies simultaneously excited wherein the frequency versus temperature characteristic of one resonance is substantially cubic over the temperature range of interest and the other resonance having a substantially linear frequency versus temperature characteristic.

A further object of this invention is to provide an apparatus for utilizing such a resonator that generates a temperature compensated frequency output signal in which the frequency mode having the cubic characteristic is compensated in response to an error signal derived by the difference between that frequency and the other frequency mode utilized as a thermometer.

In an embodiment of this invention, an AT-cut crystal resonator yields two different resonant frequencies simultaneously. The resonator consists of a generally rectangular polyhedron made of quartz crystal. First and second electrodes are disposed on opposing faces of the resonator for coupling electrical energy thereto. The ratio of width to height (W/H) of the resonator is selected within the range of 8 to 25. The width (W) dimension is selected such that substantial first and second motional capacitances occur as do first and second signals responsive to the coupled thickness shear and flexure modes. The AT rotation angle is selected so that one of the two resonances has a cubic frequency versus temperature response over a desired temperature range. Preferably, the magnitude of the two motional capacitances (and of the first and second signals) are within 20% of each other, and the AT rotational angle is within the range of 34.00–34.50 degrees.

An embodiment of an apparatus for generating an output signal having a substantially stable frequency versus temperature characteristic includes a crystal resonator having two different frequencies resonant frequencies which are simultaneously excited. A means is provided for generating first and second signals corresponding to the two resonances. A comparator compares the frequencies of the first and second signals and generates an error signal representing the difference in these frequencies. A means for compensating one of the first and second signals in response to the error signal is utilized to minimize frequency variation of the one for temperature changes.

DETAILED DESCRIPTION

Figure 1:
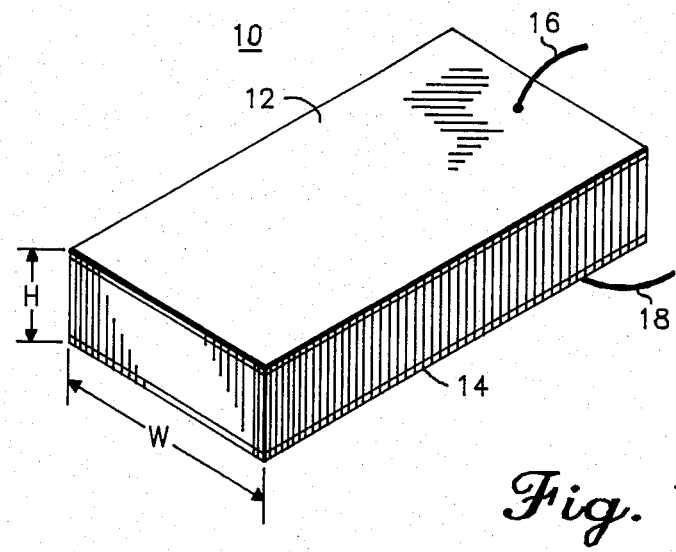
FIG. 1 is an isometric view of an embodiment of a quartz resonator according to the present invention.

FIG. 1 illustrates a quartz resonator 10 according to the present invention which consists of a generally rectangular polyhedron having a width W, and height H. This resonator has an AT angle of rotation or "cut" wherein W and H coincide with the x and y axis in the rotated AT coordinate system. Electrodes 12 and 14 are disposed on opposite faces along the width dimension and preferably cover the entire respective faces. Leads 16 and 18 are connected to electrodes 12 and 14, respectively, and serve to couple electrical energy to resonator 10.

Figure 2:
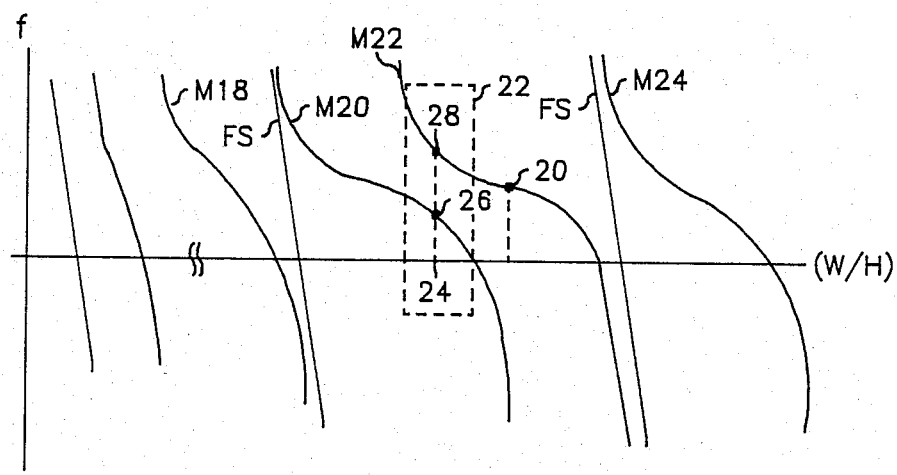
FIG. 2 is a graph showing characteristic frequency versus width to height ratio responses for various modes in a quartz resonator.

FIG. 2 illustrates a family of curves representing different modes of operation of a coupled thickness shear flexure AT quartz resonator. The ordinate represents normalized frequency (f) and the abscissa represents the width to height ratio (W/H) of the resonator. This exemplary graph is presented merely to facilitate an understanding of the present invention.

A conventional AT rotated crystal typically has it's W/H ratio selected to define an operating point 20 on the relatively flat portion of a characteristic curve M22. This results in a resonator having a dominant X-thickness shear mode of operation and no significant coupling to other types of modes. In the characteristic modes identified as M18, M20, M22 and M24, the number following the M represents the number of half waves of flexure. The curves identified as FS represent modes known as face shear. These face shear modes occur only between every other thickness shear mode, i.e. between M18 and M20, and between M22 and M24, but not between M20 and M22. The face shear modes do not couple as strongly to the thickness shear mode, as do the flexure modes, hence the straight line appearance of the FS lines in FIG. 2.

In practicing the present invention, it is important that the W/H dimension be selected so that the motional capacitance of the two successive thickness shear flexure coupling regions yield motional capacitances within 20% of each other. The region identified as 22 in FIG. 2 defines such a coupling region. For example, by selecting a W/H dimension identified as 24 operating points 26 and 28 on curves M20 and M22 are defined. It is important that substantially similar motional capacitance magnitudes result so that neither operating point (resonance) will so dominate over the other that the lesser resonance (frequency) will be impractical to utilize. Each mode as defined by operating points 26 and 28 has a different frequency of operation.

Preferably region 22 is selected so that no substantial face shear excitation occurs. This can be accomplished by selecting W so that the number of flexural half waves of the lower frequency mode (M20) when divided by 2 is an even number, i.e. $20 \div 2 = 10$.

Figure 3:
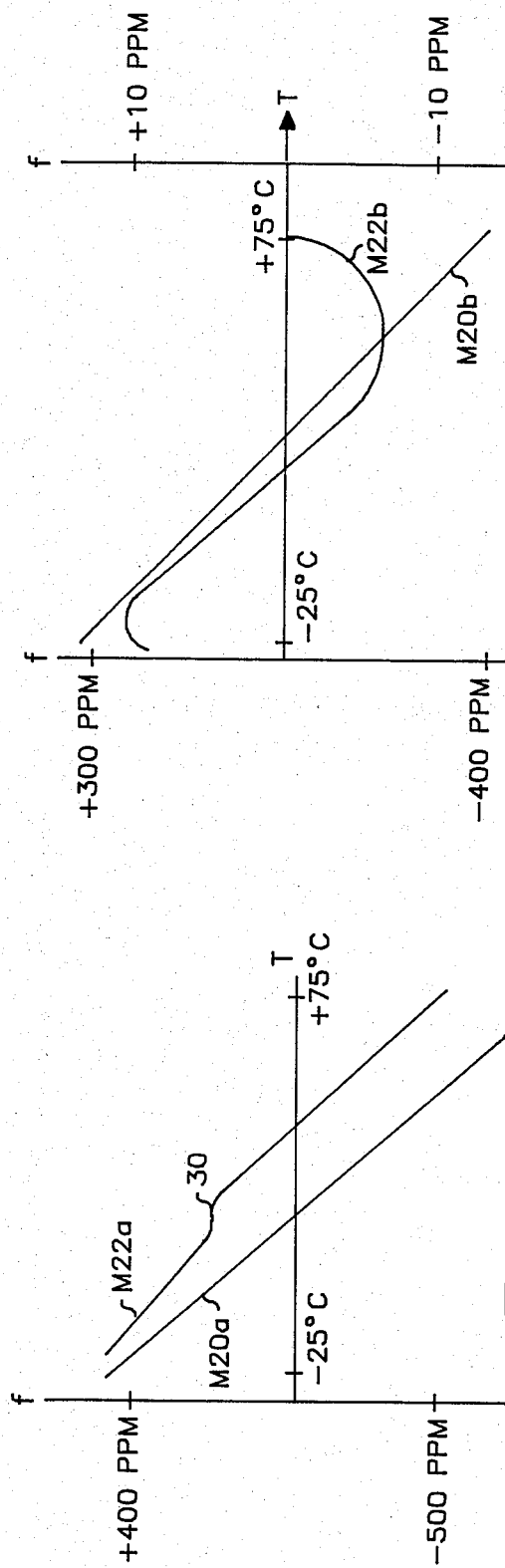
FIG. 3 is a graph showing an exemplary frequency versus temperature characteristic for a coupled flexure and thickness-shear mode of a conventional AT rotation resonator.

In FIG. 3, curves M20a and M22a represent the corresponding changes in frequency in parts per million (ppm) for temperature variations corresponding to the operating points 26 and 28 on curves M20 and M22, respectively, for a conventional AT-cut crystal having a rotation angle of 35 degrees or slightly greater. It will be noted that curve M20a is substantially linear and that curve M22a contains a generally cubic type anomaly 30. It will be apparent that neither mode of the resonator having the two characteristic curves shown in FIG. 3 would be desirable for use in controlling the frequency in an oscillator which requires that a stable frequency be maintained over temperature variations.

Figure 4:
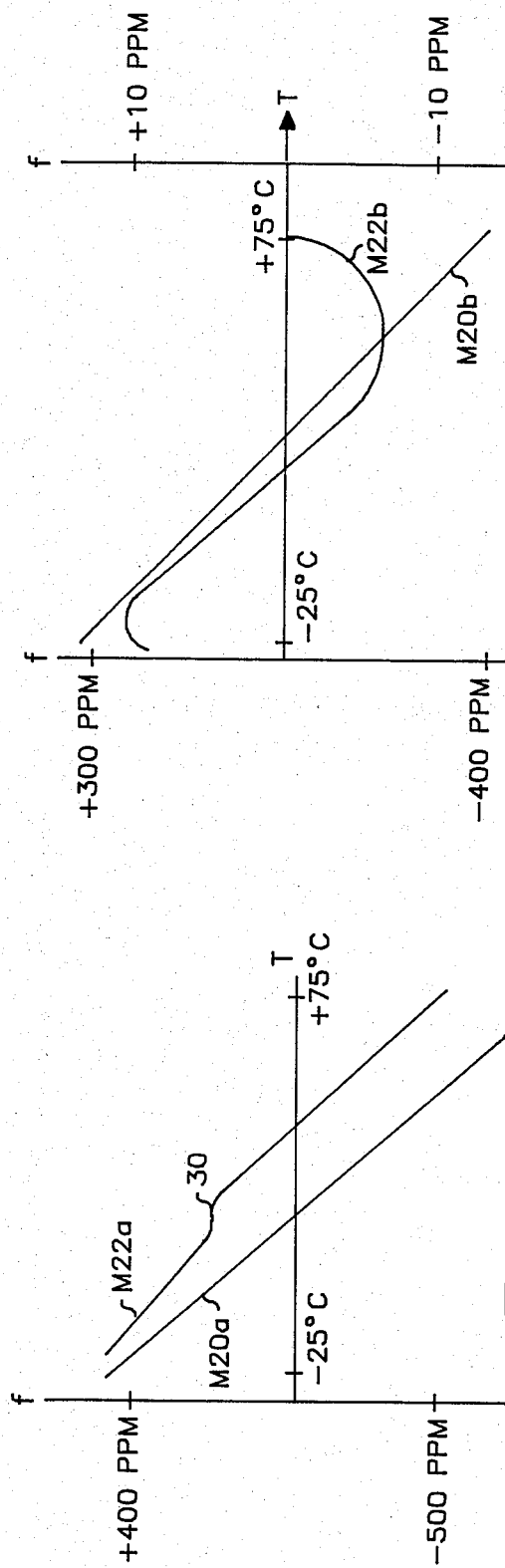
FIG. 4 is a graph showing a representative curve of the frequency versus temperature characteristic for coupled flexural and thickness-shear modes of an embodiment of the present invention in which the angle of rotation has been selected to give one of the modes a cubic response over the temperature range of interest.

FIG. 4 illustrates representative frequency versus temperature characteristic curves M20b and M22b corresponding to curves M20 and M22 of FIG. 2 wherein the AT angle of rotation is about 34.35 degrees. The frequency variations of curves M20b and M22b are read from the left and right ordinates, respectively. It will be apparent that the frequency variations of curve M22b do not exceed ±10 parts per million over the temperature range of −25° C. to +75° C. Curve M20b, for the same temperature range, exhibits a frequency change of +300 parts per million to −400 parts per million. It will be apparent that curve M20b exhibits a frequency variation which is substantially linear and which is more than 10 times greater than the frequency variations associated with curve M22b. Thus, this provides a quartz resonator having one frequency of oscillation (resonance) having a relatively stable frequency versus temperature response and another frequency having a relatively large linear frequency versus temperature characteristic.

In order to modify the frequency versus temperature characteristics exemplified in FIG. 3 for a conventional AT-cut crystal having a rotation angle of 35 degrees and greater to that exemplified in FIG. 4, the angle of rotation for the AT-cut should be selected from the range of 34.00° to 34.50° depending upon the relevant temperature range of interest. For commonly desired temperature ranges generally centered about room temperature, i.e. 25° C., a range of 34.30°–34.40° AT angle rotation is preferred.

Figure 5:
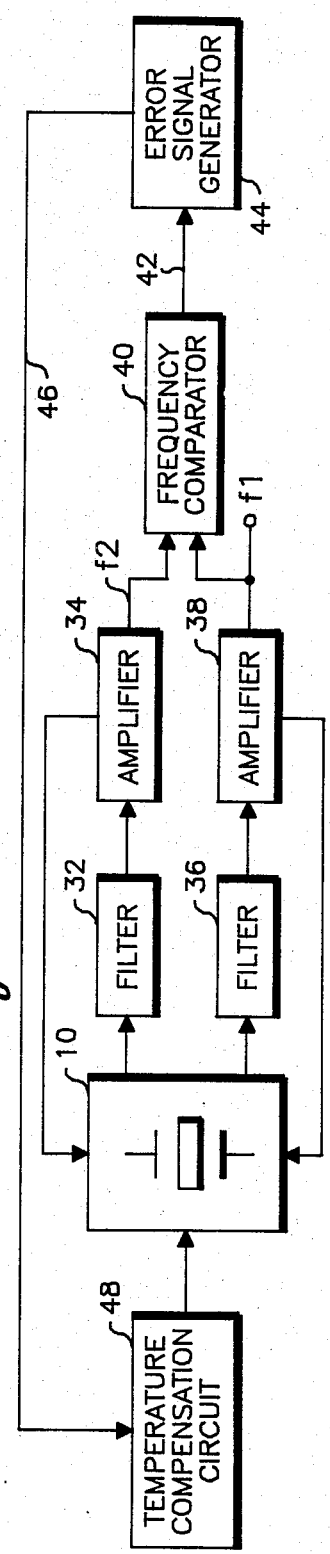
FIG. 5 is a block diagram illustrating an embodiment of an apparatus according to the present invention for generating a temperature compensated output signal.

FIG. 5 illustrates an apparatus in which resonator 10 is excited in coupled flexure and thickness shear modes, and which provides compensation to resonator 10 to yield a temperature compensated output frequency f1. A first oscillator consisting of filter 32, amplifier 34 and resonator 10 generate an output frequency f2 respresentative of the thermometer response (M20b in FIG. 4). A second oscillator consisting of filter 36, amplifier 38 and resonator 10 generate an output frequency f1 corresponding to the cubic frequency versus temperature response (M22b in FIG. 4). The respective filters 32 and 36 serve to limit each of the oscillators to one of the two frequencies which are excited in resonator 10.

The output frequencies f1 and f2 from the two oscillators are coupled to a frequency comparator 40 which compares frequency f1 with the frequency of f2 and provides an output signal 42 which is responsive to the difference between these frequencies. An error signal generator 44 receives the output 42 from frequency comparator 40 and generates an error signal 46 which controls a temperature compensation circuit 48 which is coupled to resonator 10 to minimize variations in frequency of signal f1 due to temperature variations. Temperature compensation circuit 48 may consist of a variable reactance circuit such as a varactor diode. Since the purpose of the error signal generator 44 is to provide an appropriate error correction signal to temperature compensation circuit 48 in response to signal 42, the error signal generator 44 may consist of a suitable non-linear network consisting of resistors and diodes to provide the appropriate error signal 46 or may alternatively consist of a digital implementation such as a microprocessor which utilizes a pre-programmed look up data table to develop the appropriate error signal. The apparatus shown in FIG. 5 operates to produce an output signal f1 having a very stable frequency versus temperature characteristic due to the temperature compensation provided.

This invention also contemplates a method for generating an output signal having a substantially stable frequency versus temperature characteristic by utilizing a quartz resonator 10 having simultaneously a thickness shear mode coupled to two consecutive flexure modes. The method includes the step of generating first and second signals corresponding to the thickness shear mode coupled to one flexure mode and the thickness shear mode coupled to the other flexure mode, comparing the frequencies of the first and second signals, generating an error signal representing the difference in frequency between the first and second signals, and compensating one of the first and second signals in response to the error signal to minimize variation of the frequency of the one signal for temperature variations.

Although embodiments of the present invention are described and shown herein, it will be understood that various changes and modifications may be made by those skilled in the art without departing from the scope of the present invention as defined by the claims appended hereto.

What is claimed is:

1. An AT-cut quartz resonator having two different sets of coupled modes simultaneously occurring that produces two resonant frequencies comprising:
    a generally rectangular quartz polyhedron;
    first and second electrodes disposed on opposing faces of said polyledron for coupling electrical energy thereto;
    the ratio of width to height (W/H) of said polyhedron being within the range of 8 to 25;
    the width (W) dimension of said polyhedron selected such that a first mode set consisting of a thickness shear mode coupled to a first flexure mode and a second mode set consisting of said thickness shear mode coupled to second flexure mode are simultaneously excitable and result in respective first and second signals of different frequencies, the first signal having a substantial magnitude relative to the magnitude of the second signal; and
    said polyhedron including means for causing one of the first and second signals to have a substantially cubic frequency versus temperature response over a predetermined temperature range, said means comprising said polyhedron having an AT rotation angle within the range of 34.00–34.50 degrees.

2. The resonator according to claim 1 wherein said W/H ratio is between 10 and 20.

3. The resonator according to claim 1 wherein the magnitude of the first signal is within the range of ±20% of the magnitude of the second signal.

4. The resonator according to claim 1 wherein said AT rotation angle is within the range of 34.30–34.40 degrees.

5. The resonator according to claim 1 wherein said width of the polyhedron is selected so that no substantial excitation of a face shear mode occurs.

6. The resonator according to claim 5 wherein said width of the polyhedron is selected such that the number of half-waves of flexure of the one of the first and second flexure modes coupled to said thickness shear mode that produces the lower frequency signal, when divided by 2, is an even number thereby avoiding any substantial coupling to a face shear mode.

7. The resonator according to claim 1 wherein said first and second electrodes substantially cover said opposing faces.

8. The resonator according to claim 1 wherein said means causes the frequency versus temperature characteristic of the other of the first and second signals to be substantially linear over said temperature range.

9. In an apparatus for generating an output signal wherein variations in the frequency of the signal due to temperature changes are minimized, the apparatus having a quartz resonator in which two different sets of resonant modes are simultaneously excited, means for generating first and second signals corresponding respectively to the two sets of resonant modes, means for comparing the frequencies of the first and second signals and generating an error signal representing the difference in frequency of the first and second signals, and means for compensating one of the first and second signals in response to the error signal to minimize frequency variation of the one for temperature changes, the improvement in the resonator comprising:
    a generally rectangular polyhedron consisting of an AT-cut quartz crystal;
    first and second electrodes disposed on opposing faces of said crystal for coupling said resonator to said generating means;
    the ratio of width to height (W/H) of said polyhedron being within the range of 8 to 25;
    the width (W) dimension of said polyhedron selected such that a first mode set consisting of a thickness shear mode coupled to a first flexure mode and a second mode set consisting of said thickness shear mode coupled to a second flexure mode are simultaneously excitable, said first signal having a substantial magnitude relative to said second signal; and
    said polyhedron including means for causing one of the first and second signals to have a substantially cubic frequency versus temperature response over a desired temperature range, said causing means comprising said polyhedron having an AT rotation angle within the range of 34.00–34.50 degrees.

10. The apparatus according to claim 9 wherein said W/H ratio is between 10 and 20.

11. The apparatus according to claim 9 wherein the magnitude of the first signal is within the range of ±20% of the magnitude of the second signal.

12. The apparatus according to claim 9 wherein said AT rotation angle is within the range of 34.30–34.40 degrees.

13. The apparatus according to claim 9 wherein said width of the polyhedron is selected so that no substantial excitation of a face shear mode occurs.

14. The apparatus according to claim 13 wherein said width of the polyhedron is selected such that the number of half-waves of flexure of the one of the first and second flexure modes coupled to said thickness shear mode that produces the lower frequency signal, when divided by 2, is an even number thereby avoiding any substantial coupling to a face shear mode.

15. The apparatus according to claim 9 wherein said first and second electrodes substantially cover said opposing faces.

16. The apparatus according to claim 9 wherein said causing means causes the frequency versus temperature characteristic of the other of the first and second signals to be substantially linear over the desired temperature range.

17. A method for generating an output signal wherein variations in the frequency of the signal due to temperature changes are minimized comprising the steps of:
  making an AT-cut quartz resonator having a generally rectangular polyhedron shape;
  disposing first and second electrodes on opposing faces of the resonator;
  selecting a width to height (W/H) ratio for the resonator within the range of 8 to 25;
  selecting the width (W) dimension of the resonator so that a first mode set consisting of a thickness shear mode coupled to a first flexure mode and a second mode set consisting of said thickness shear mode coupled to a second flexure mode are simultaneously excitable;
  generating first and second signals corresponding respectively to said first and second mode sets, the first signal having a substantial magnitude relative to the magnitude of the second signal;
  selecting the AT rotation angle such that one of the first and second signals has a cubic frequency versus temperature response over a desired temperature range and the other of the first and second signals has a substantially linear frequency versus temperature characteristic over said temperature range, said AT rotation angle being within the range of 34.00–34.50 degrees;
  comparing the frequencies of the first and second signals;
  generating an error signal responsive to the difference in frequency between the first and second signals; and
  compensating said one of the first and second signals in response to the error signal to minimize frequency variations of the one for temperature changes.

18. The method according to claim 17 comprising the step of selecting the W/H ratio to be within the range of 10 to 20.

19. The method according to claim 17 comprising the step of selecting the width of the resonator such that the magnitude of the first signal is within 20% of the second signal.

20. The method according to claim 17 comprising the step of selecting the AT rotational angle within the range of 34.30 to 34.40 degrees.

21. An AT-cut quartz resonator having two different sets of coupled modes simultaneously occurring that produces two resonant frequencies comprising:
  a generally rectangular quartz polyhedron;
  first and second electrodes disposed on opposing faces of said polyledron for coupling electrical energy thereto;
  the ratio of width to height (W/H) of said polyhedron being within the range of 8 to 25;
  the width (W) dimension of said polyhedron selected such that a first mode set consisting of a thickness shear mode coupled to a first flexure mode and a second mode set consisting of said thickness shear mode coupled to second flexure mode are simultaneously excitable and result in respective first and second signals of different frequencies, the first signal having a substantial magnitude relative to the magnitude of the second signal; and
  said polyhedron having an AT rotation angle within the range of 34.00–34.50 degrees.

22. The resonator according to claim 21 wherein said W/H ratio is between 10 and 20.

23. The resonator according to claim 21 wherein the magnitude of the first signal is within the range of ±20% of the magnitude of the second signal.

24. The resonator according to claim 21 wherein said AT rotation angle is within the range of 34.30–34.40 degrees.

25. The resonator according to claim 21 wherein said width of the polyhedron is selected so that no substantial excitation of a face shear mode occurs.

26. The resonator according to claim 25 wherein said width of the polyhedron is selected such that the number of half-waves of flexure of the one of the first and second flexure modes coupled to said thickness shear mode that produces the lower frequency signal, when divided by 2, is an even number thereby avoiding any substantial coupling to a face shear mode.

27. The resonator according to claim 21 wherein said first and second electrodes substantially cover said opposing faces.

* * * * *